United States Patent
Hsu et al.

(10) Patent No.: US 8,120,441 B2
(45) Date of Patent: Feb. 21, 2012

(54) CIRCUIT BOARD WITH A REFERENCE PLANE HAVING MULTI-PART NON-CONDUCTIVE REGIONS FOR DECREASED CROSSTALK

(75) Inventors: Hsing-Chou Hsu, Tainan County (TW); Tung-Yang Chen, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 218 days.

(21) Appl. No.: 12/628,221

(22) Filed: Dec. 1, 2009

(65) Prior Publication Data

US 2011/0128086 A1 Jun. 2, 2011

(51) Int. Cl.
*H01P 3/08* (2006.01)
(52) U.S. Cl. .............................. 333/4; 333/33
(58) Field of Classification Search ........... 333/1, 4, 333/5, 238, 33
See application file for complete search history.

(56) References Cited

U.S. PATENT DOCUMENTS

| | | | |
|---|---|---|---|
| 2005/0083152 A1* | 4/2005 | Hsu et al. | 333/238 |
| 2009/0079523 A1* | 3/2009 | Hsu | 333/246 |

* cited by examiner

*Primary Examiner* — Benny Lee
(74) *Attorney, Agent, or Firm* — Winston Hsu; Scott Margo

(57) ABSTRACT

A circuit board includes a signal line plane and a reference plane. The signal line plane has at least a first transmission line and a second transmission line formed thereon. The reference plane has a conductive region and at least a non-conductive region. The first transmission line and the second transmission line overlap the conductive region in a thickness direction of the circuit board. The non-conductive region includes at least a first part and a second part connected to the first part, where the second part is positioned between the projection of the first transmission line on the reference plane and the projection of the second transmission line on the reference plane, and has no intersection with at least one of the projection of the first transmission line and the projection of the second transmission line.

6 Claims, 10 Drawing Sheets

(a) Near-end Crosstalk (b) Far-end Crosstalk

CIRCUIT BOARD WITH A REFERENCE PLANE HAVING MULTI-PART NON-CONDUCTIVE REGIONS FOR DECREASED CROSSTALK

BACKGROUND OF THE INVENTION

1. Field of the Invention

The present invention relates to a circuit board, and more particularly, to a circuit board which can decrease undesired crosstalk.

2. Description of the Prior Art

In electronics, the term "crosstalk" refers to any phenomenon by which a signal transmitted on one circuit or channel of a transmission system creates an undesired effect in another circuit or channel. Crosstalk is usually caused by undesired capacitive, inductive, or conductive coupling from one circuit, part of a circuit, or channel, to another.

In telecommunications or telephony, crosstalk is often distinguishable as pieces of speech or signaling tones leaking from other connections. If the connection is analog, twisted pair cabling can often be used to reduce the effects of crosstalk. Alternatively, the signals can be converted to digital form, which is much less susceptible to crosstalk.

In an integrated circuit design, crosstalk normally refers to a signal affecting another nearby signal. Usually the coupling is capacitive, and to the nearest neighbor, but other forms of coupling and effects on signals further away are sometimes important, especially in analog designs. Please refer to FIG. 1. FIG. 1 is a schematic top view of a prior art circuit board 100. The circuit board 100 includes a signal line plane 110 and a reference plane 120, where the signal line plane (e.g., a top plane as shown in FIG. 1) 110 is parallel with the reference plane (e.g., a bottom plane as shown in FIG. 1) 120 in a thickness direction of the circuit board 100. The signal line plane 110 has a first transmission line 112 and a second transmission line 114 formed thereon, wherein the first transmission line 112 and the second transmission line 114 have no intersection on the signal line plane 110. The reference plane 120 has a conductive region 122 (i.e., physical board region) and a non-conductive region 124 (i.e., a scribe line or through hole). As shown in FIG. 1, the first transmission line 112 and the second transmission line 114 overlap the conductive region 122 in a thickness direction of the circuit board 100. In general, the signal line plane 110 and the reference plane 120 is spaced by a dielectric layer; however, to more clearly show the relation between the first and second transmission lines 112, 114 on the signal line plane 110 and the conductive region 122 and the non-conductive region 124 on the reference plane 120, the dielectric layer is not shown in FIG. 1. As shown in FIG. 1, a projection of the first transmission line 112 onto the reference plane 120 in a thickness direction of the circuit board 100 and a projection of the second transmission line 114 onto the reference plane 120 in the thickness direction of the circuit board 100 have intersections with the non-conductive region 124. The substrate coupling will cause the crosstalk to be conveyed through the circuit board 100.

Therefore, how to decrease crosstalk effectively in a circuit board is an urgent issue that needs to be resolved.

SUMMARY OF THE INVENTION

Therefore, one of the objectives of the present invention is to provide a circuit board which can decrease crosstalk.

According to an embodiment of the present invention, a circuit board is disclosed. The circuit board includes a signal line plane and a reference plane. The signal line plane has at least a first transmission line and a second transmission line formed thereon, wherein the first transmission line and the second transmission line have no intersection on the signal line plane. The reference plane has a conductive region and at least a non-conductive region, and the first transmission line and the second transmission line overlap the conductive region in a thickness direction of the circuit board. In addition, the non-conductive region includes at least a first part and a second part connected to the first part, where at least one of a projection of the first transmission line onto the reference plane in a thickness direction of the circuit board and a projection of the second transmission line onto the reference plane in the thickness direction of the circuit board has an intersection with the first part; additionally, the second part is positioned between the projection of the first transmission line on the reference plane and the projection of the second transmission line on the reference plane, and has no intersection with at least one of the projection of the first transmission line and the projection of the second transmission line.

These and other objectives of the present invention will no doubt become obvious to those of ordinary skill in the art after reading the following detailed description of the preferred embodiment that is illustrated in the various figures and drawings.

DETAILED DESCRIPTION OF THE INVENTION

Figure 1:
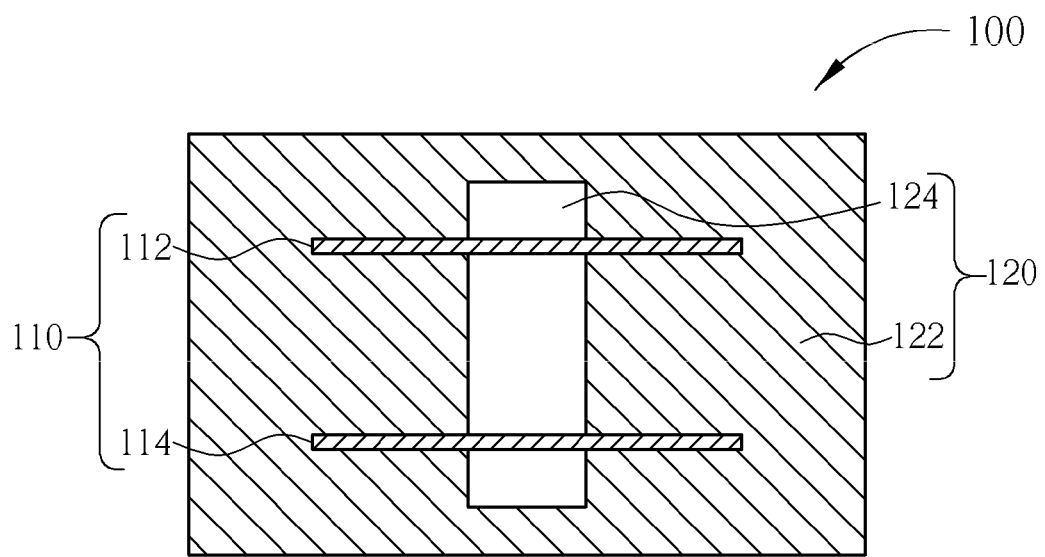
FIG. 1 is a schematic top view of a prior art circuit board.

With regard to the schematic top views of different exemplary circuit boards of the present invention, only a layout pattern on a signal line plane and a layout pattern on a reference plane are shown for simplicity, where a dielectric layer generally disposed between the signal line plane and the reference plane is omitted for a clear illustration of the relation between the layout pattern on the signal line plane and the layout pattern on the reference plane. In addition, a direction perpendicular to the drawing sheet on which an exemplary circuit board of the present invention is shown is defined to be a thickness direction of the illustrated exemplary circuit board, and the signal line plane is parallel with the reference plane in the thickness direction of the circuit board.

Figure 2:
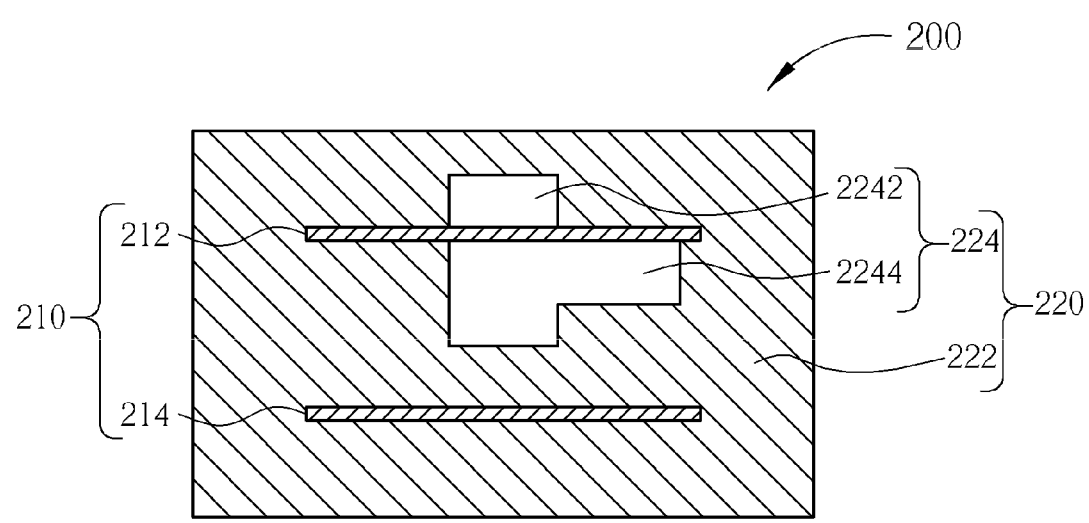
FIG. 2 is a schematic top view of a circuit board according to a first embodiment of the present invention.

Please refer to FIG. 2. FIG. 2 is a schematic top view of a circuit board 200 according to a first embodiment of the present invention. The exemplary circuit board 200 includes a signal line plane 210 and a reference plane 220. The signal line plane 210 has a first transmission line 212 and a second transmission line 214 formed thereon, wherein the first transmission line 212 and the second transmission line 214 have no intersection on the signal line plane 210. The reference plane 220 has a conductive region 222 (e.g., a physical board region) and a non-conductive region 224 (e.g., a scribe line or through hole), and the first transmission line 212 and the second transmission line 214 overlap the conductive region 222 in a thickness direction of the circuit board 200. The non-conductive region 224 includes a first part 2242 and a second part 2244 connected to the first part 2242. As can be seen from FIG. 2, a projection of the first transmission line 212 onto the reference plane 220 in the thickness direction of the circuit board 200 has an intersection with the first part 2242. The second part 2244 is positioned between the projection of the first transmission line 212 on the reference plane 220 and the projection of the second transmission line 214 on the reference plane 220, and has no intersection with the projection of the second transmission line 214.

Figure 3:
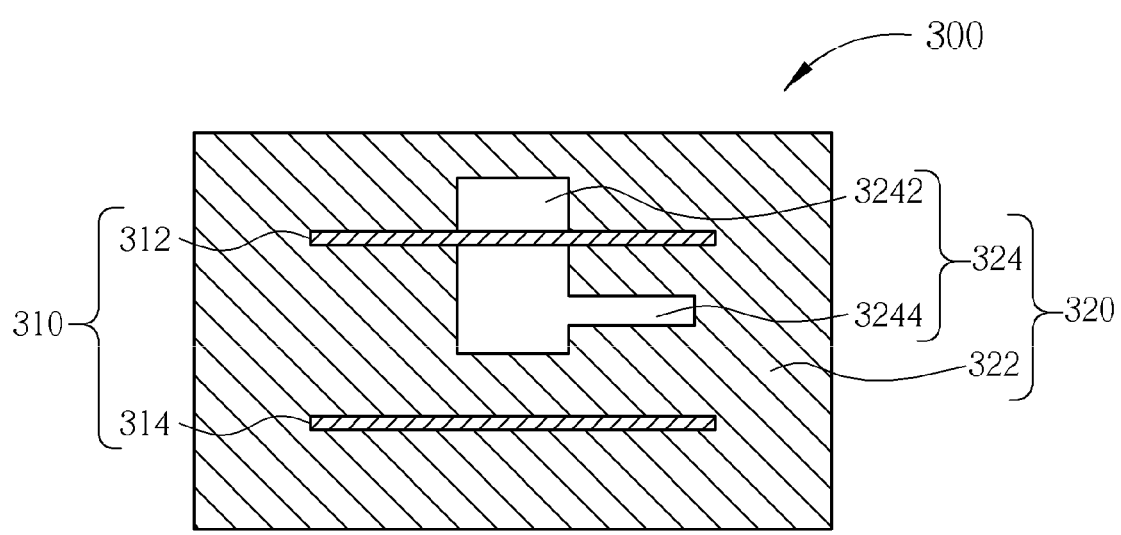
FIG. 3 is a schematic top view of a circuit board according to a second embodiment of the present invention.

Please refer to FIG. 3. FIG. 3 is a schematic top view of a circuit board 300 according to a second embodiment of the present invention. The exemplary circuit board 300 includes a signal line plane 310 and a reference plane 320, where the signal line plane 310 has a first transmission line 312 and a second transmission line 314 formed thereon, and the reference plane 320 has a conductive region 322 and a non-conductive region 324 including a first part 3242 and a second part 3244. The exemplary circuit board 300 shown in FIG. 3 is similar to the circuit board 200 shown in FIG. 2. The difference between the circuit board 300 and the circuit board 200 is that the second part 3244 has no intersection with the projection of the first transmission line 312 and the projection of the second transmission line 314 on the reference plane 320 in the thickness direction of the circuit board 300.

Figure 4:
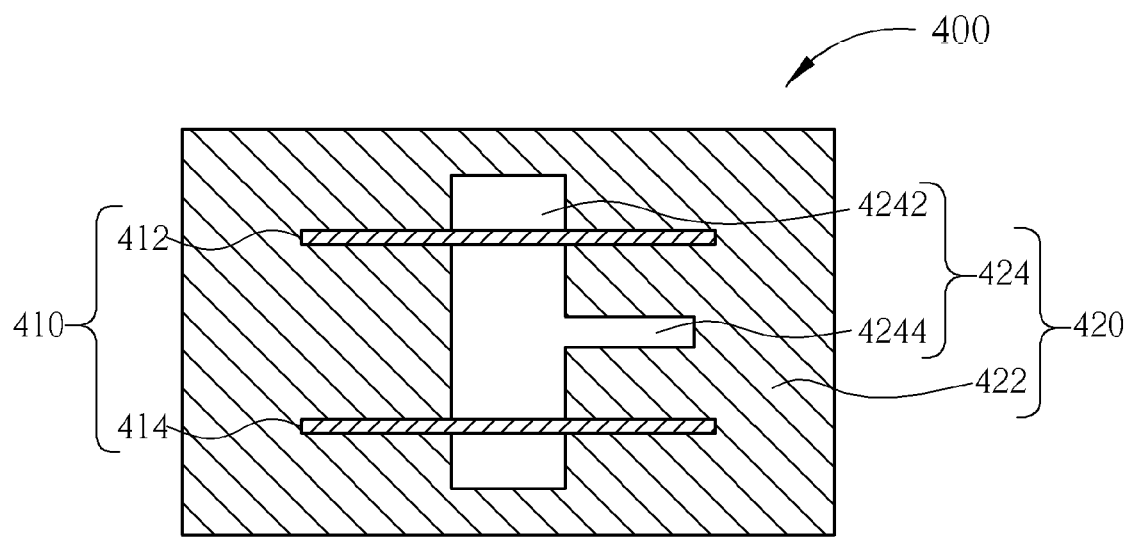
FIG. 4 is a schematic top view of a circuit board according to a third embodiment of the present invention.

Please refer to FIG. 4. FIG. 4 is a schematic top view of a circuit board 400 according to a third embodiment of the present invention. The exemplary circuit board 400 includes a signal line plane 410 and a reference plane 420, where the signal line plane 410 has a first transmission line 412 and a second transmission line 414 formed thereon, and the reference plane 420 has a conductive region 422 and a non-conductive region 424 including a first part 4242 and a second part 4244. The circuit board 400 shown in FIG. 4 is similar to the circuit board 300 shown in FIG. 3. The difference between the circuit board 400 and the circuit board 300 is that a projection of the first transmission line 412 onto the reference plane 420 in a thickness direction of the circuit board 400 and a projection of the second transmission line 414 onto the reference plane 420 in the thickness direction of the circuit board 400 have intersections with the first part 4242.

Figure 5:
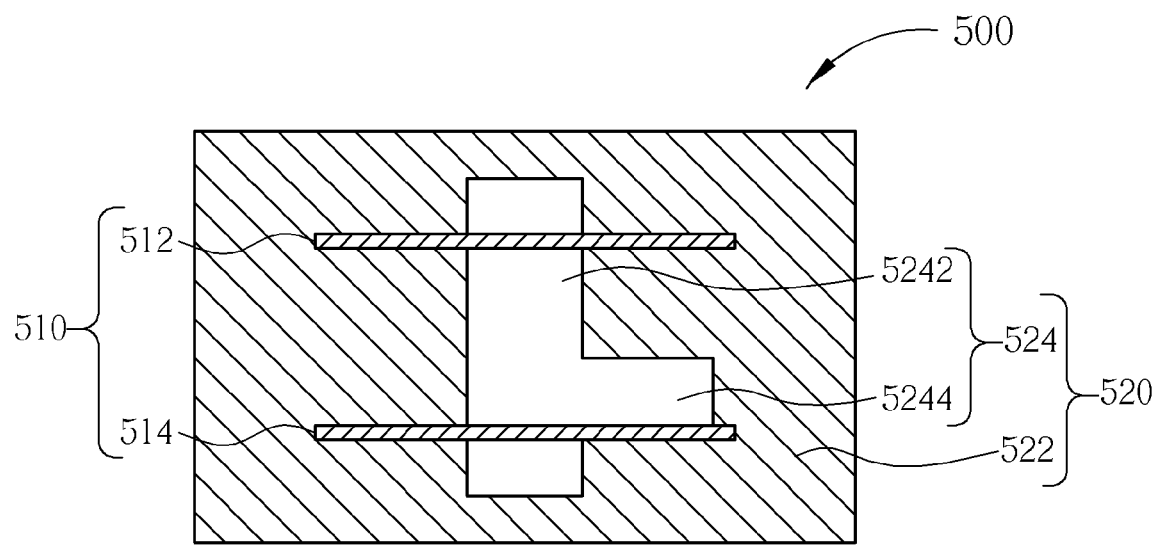
FIG. 5 is a schematic top view of a circuit board according to a fourth embodiment of the present invention.

Please refer to FIG. 5. FIG. 5 is a schematic top view of a circuit board 500 according to a fourth embodiment of the present invention. The exemplary circuit board 500 includes a signal line plane 510 and a reference plane 520, where the signal line plane 510 has a first transmission line 512 and a second transmission line 514 formed thereon, and the reference plane 520 has a conductive region 522 and a non-conductive region 524 including a first part 5242 and a second part 5244. The circuit board 500 shown in FIG. 5 is similar to the circuit board 400 shown in FIG. 4. The difference between the circuit board 500 and the circuit board 400 is that the second part 5244 has an intersection with the projection of the second transmission line 514 on the reference plane 520 in a thickness direction of the circuit board 500.

Figure 6:
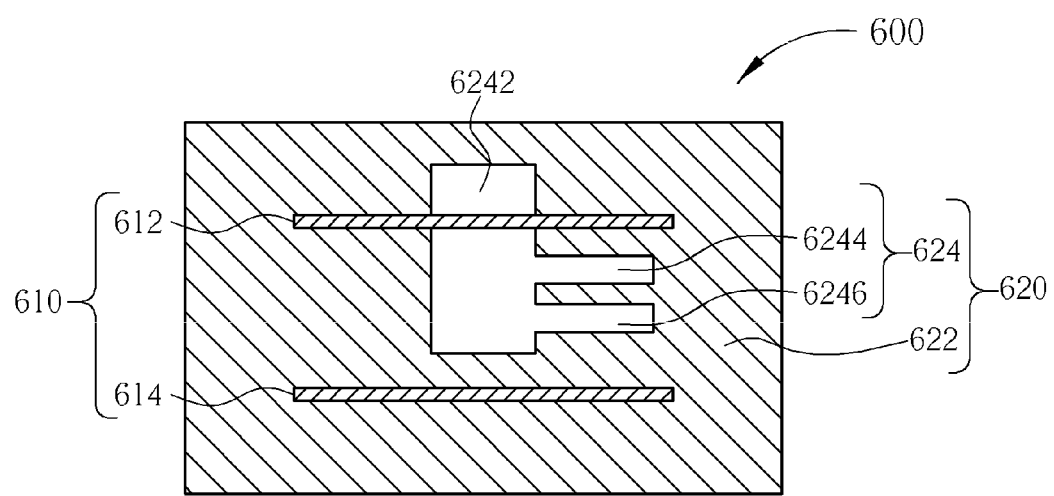
FIG. 6 is a schematic top view of a circuit board according to a fifth embodiment of the present invention.

Please refer to FIG. 6. FIG. 6 is a schematic top view of a circuit board 600 according to a fifth embodiment of the present invention. The circuit board 600 includes a signal line plane 610 and a reference plane 620. The signal line plane 610 has a first transmission line 612 and a second transmission line 614 formed thereon, wherein the first transmission line 612 and the second transmission line 614 have no intersection on the signal line plane 610. The reference plane 620 has a conductive region 622 (e.g., a physical board region) and a non-conductive region 624 (e.g., a scribe line or through hole), and the first transmission line 612 and the second transmission line 614 overlap the conductive region 622 in a thickness direction of the circuit board 600. The non-conductive region 624 includes a first part 6242, a second part 6244 connected to the first part 6242, and a third part 6246 connected to the first part 6242. As can be seen from FIG. 6, a projection of the first transmission line 612 onto the reference plane 620 in a thickness direction of the circuit board 600 has an intersection with the first part 6242. The second part 6244 and the third part 6246 are positioned between the projection of the first transmission line 612 on the reference plane 620 and the projection of the second transmission line 614 on the reference plane 620, and has no intersection with the projection of the first transmission line 612 and the projection of the second transmission line 614.

Figure 7:
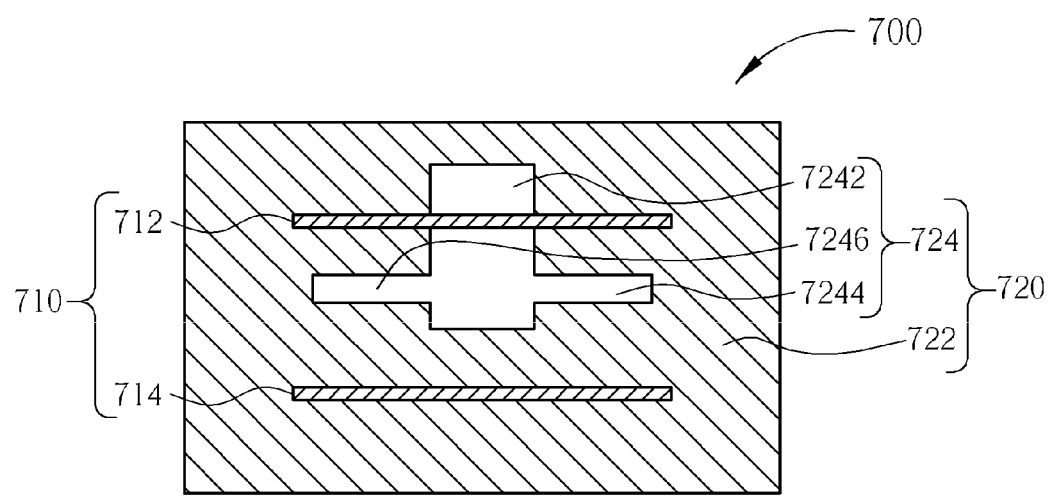
FIG. 7 is a schematic top view of a circuit board according to a sixth embodiment of the present invention.

Please refer to FIG. 7. FIG. 7 is a schematic top view of a circuit board 700 according to a sixth embodiment of the present invention. The exemplary circuit board 700 includes a signal line plane 710 and a reference plane 720, where the signal line plane 710 has a first transmission line 712 and a second transmission line 714 formed thereon, and the reference plane 720 has a conductive region 722 and a non-conductive region 724 including a first part 7242, a second part 7244, and a third part 7246. The circuit board 700 shown in FIG. 7 is similar to the circuit board 600 shown in FIG. 6. The difference between the circuit board 700 and the circuit board 600 is that the second part 7244 and the third part 7246 are extended from opposite sides of the first part 7242.

Figure 8:
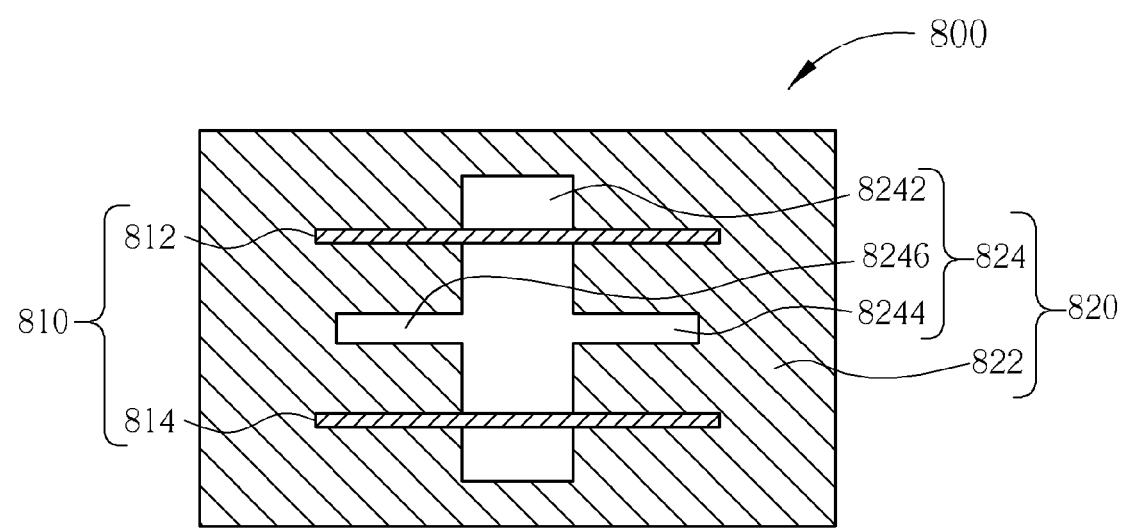
FIG. 8 is a schematic top view of a circuit board according to a seventh embodiment of the present invention.

Please refer to FIG. 8. FIG. 8 is a schematic top view of a circuit board 800 according to a seventh embodiment of the present invention. The exemplary circuit board 800 includes a signal line plane 810 and a reference plane 820, where the signal line plane 810 has a first transmission line 812 and a second transmission line 814 formed thereon, and the reference plane 820 has a conductive region 822 and a non-conductive region 824 including a first part 8242, a second part 8244, and a third part 8246. The circuit board 800 shown in FIG. 8 is similar to the circuit board 700 shown in FIG. 7. The difference between the circuit board 800 and the circuit board 700 is that a projection of the first transmission line 812 onto the reference plane 820 in a thickness direction of the circuit board 800 and a projection of the second transmission line 814 onto the reference plane 820 in the thickness direction of the circuit board 800 have intersections with the first part 8242.

Figure 9:
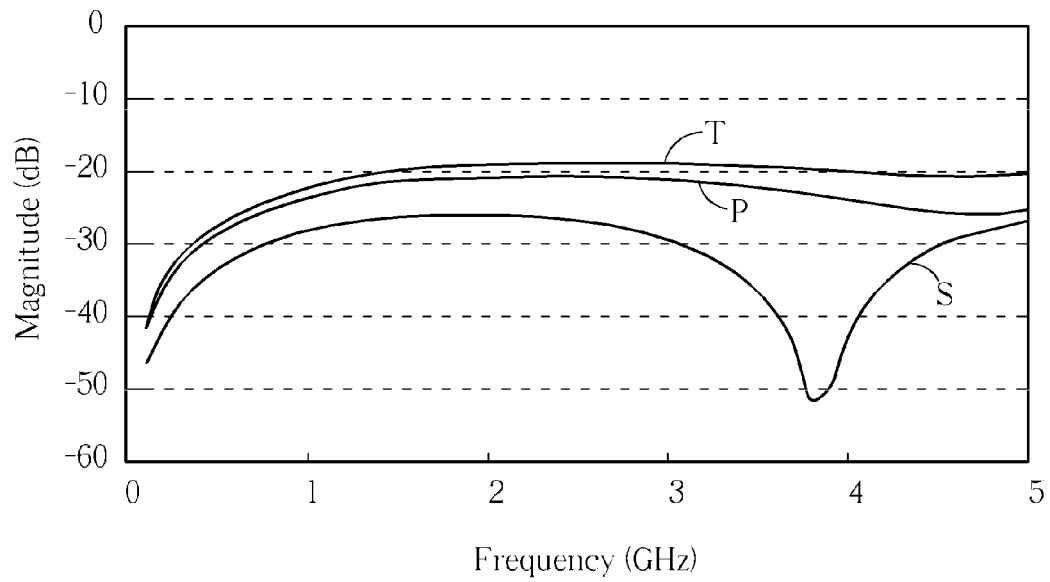
FIG. 9 is a comparison diagram illustrating three simulation results of the crosstalk phenomenon of three circuit boards in the frequency domain.
Figure 9:
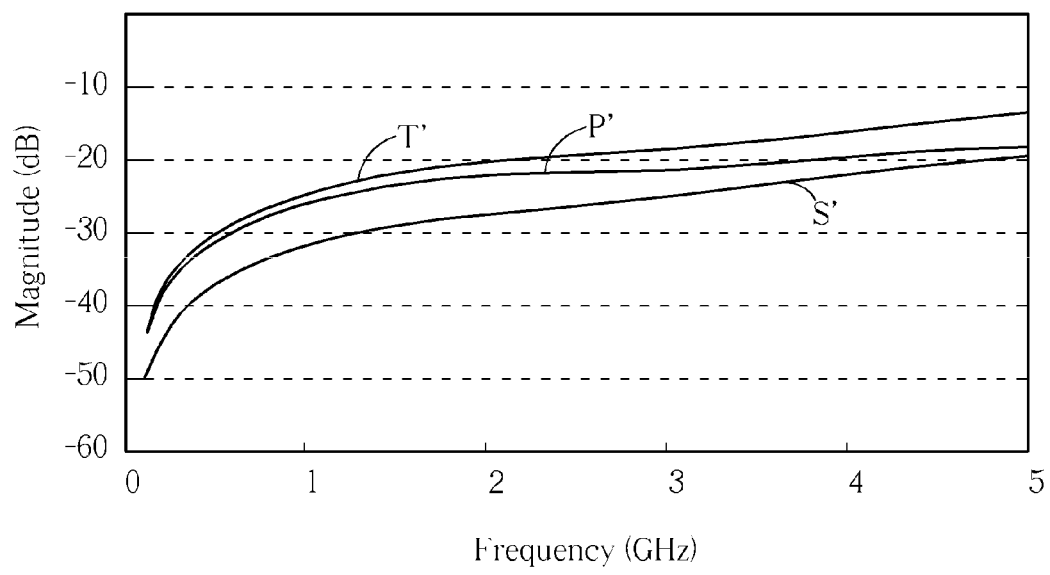

Please refer to FIG. 9 in conjunction with FIG. 8. FIG. 9 is a comparison diagram illustrating three simulation results of the crosstalk phenomenon of three circuit boards in the frequency domain. As shown in the sub-diagram FIG. 9(a) where a horizontal axis represents a frequency (GHz) and a vertical axis represents a magnitude (dB), the solid line T represents the near-end crosstalk phenomenon of an ideal circuit board; the line S represents the near-end crosstalk phenomenon of the circuit board 800 without the second part 8244 and third part 8246; and the line P represents the near-end crosstalk phenomenon of the circuit board 800. Similarly, in the sub-diagram FIG. 9(b), where a horizontal axis represents a frequency (GHz) and a vertical axis represents a magnitude (dB), the solid line T' represents the far-end crosstalk phenomenon of the ideal circuit board; the line S' represents the far-end crosstalk phenomenon of the circuit board 800 without the second part 8244 and third part 8246; and the line P' represents the far-end crosstalk phenomenon of the circuit board 800.

Figure 10:
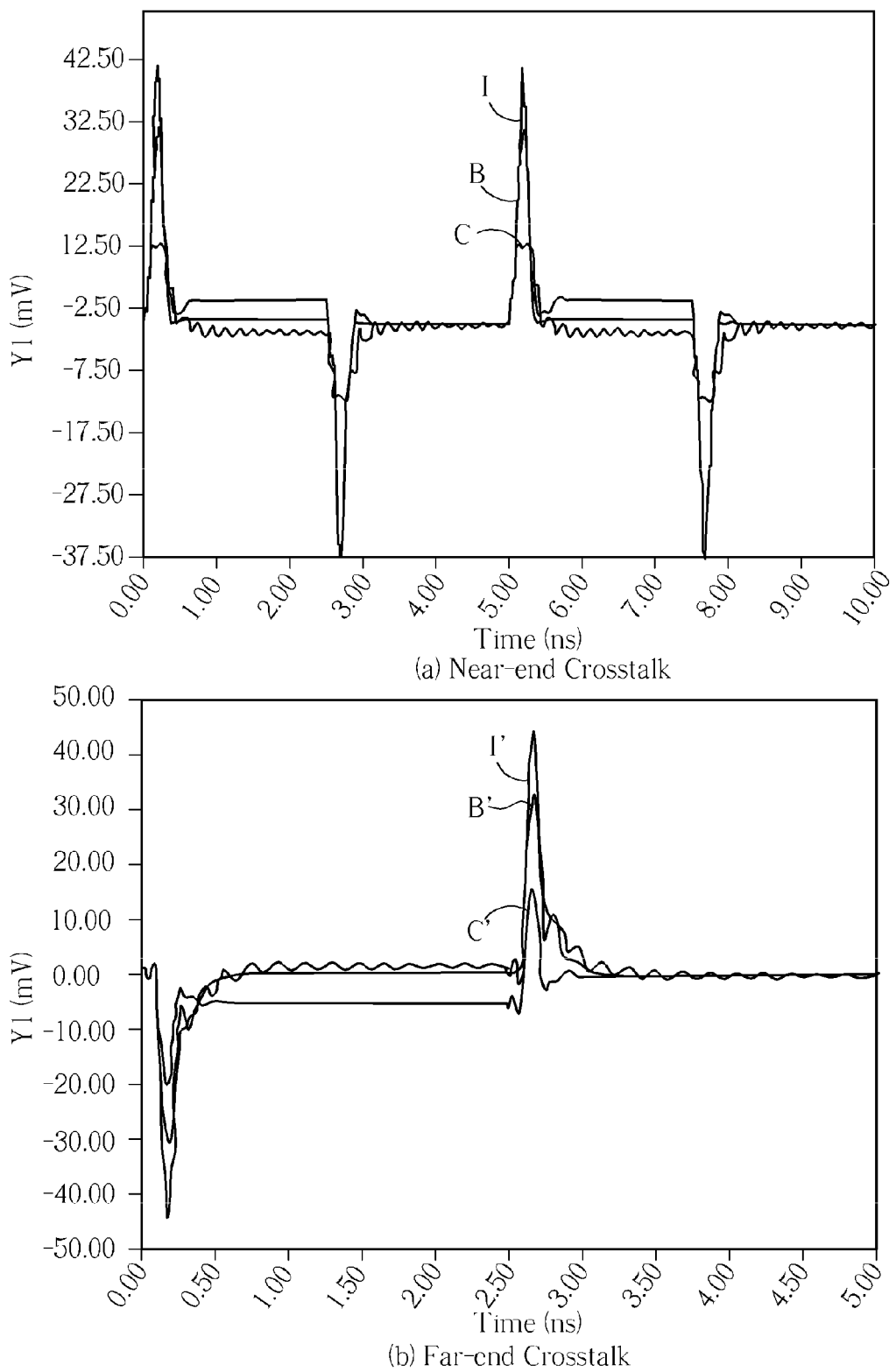
FIG. 10 is a comparison diagram illustrating three simulation results of the crosstalk phenomenon of three circuit boards in the time domain.

Please refer to FIG. 10 in conjunction with FIG. 8. FIG. 10 is a comparison diagram illustrating three simulation results of the crosstalk phenomenon of three circuit boards in the time domain. As shown in the sub-diagram FIG. 10(*a*), where a horizontal axis represents a time (ns) and a vertical axis represents a voltage Y1 (mV), the solid line I represents the near-end crosstalk phenomenon of an ideal circuit board; the line C represents the near-end crosstalk phenomenon of the circuit board 800 without the second part 8244 and third part 8246; and the line B represents the near-end crosstalk phenomenon of the circuit board 800. Similarly, in the sub-diagram FIG. 10(*b*), where a horizontal axis represents a time (ns) and a vertical axis represents a voltage Y1 (mV), the solid line I' represents the far-end crosstalk phenomenon of the idea circuit board; the line C' represents the far-end crosstalk phenomenon of the circuit board 800 without the second part 8244 and third part 8246; and the line B' represents the far-end crosstalk phenomenon of the circuit board 800.

In summary, in the above-mentioned embodiments of the present invention, when there is a first part positioned in a circuit board, at least one of a second part and a third part will also be positioned in the circuit board, increasing the coupling path to thereby decrease crosstalk. By utilizing the present invention design, both near-end crosstalk and far-end crosstalk can be significantly improved, as demonstrated by FIG. 9 and FIG. 10.

Those skilled in the art will readily observe that numerous modifications and alterations of the device and method may be made while retaining the teachings of the invention.

What is claimed is:

1. A circuit board, comprising:
a signal line plane, having at least a first transmission line and a second transmission line formed thereon, wherein the first transmission line and the second transmission line have no intersection on the signal line plane; and
a reference plane, having a conductive region and at least a non-conductive region, wherein the first transmission line and the second transmission line overlap the conductive region in a thickness direction of the circuit board; the non-conductive region comprises at least a first part and a second part connected to the first part; at least one of a projection of the first transmission line onto the reference plane in a thickness direction of the circuit board and a projection of the second transmission line onto the reference plane in the thickness direction of the circuit board has an intersection with the first part; and the second part is positioned between the projection of the first transmission line on the reference plane and the projection of the second transmission line on the reference plane, and has no intersection with at least one of the projection of the first transmission line and the projection of the second transmission line.

2. The circuit board of claim 1, wherein the first part has intersections with both the projection of the first transmission line and the projection of the second transmission line, and the second part has no intersection with both the projection of the first transmission line and the projection of the second transmission line.

3. The circuit board of claim 1, wherein the first part further comprises a third part connected to the first part; and the third part is positioned between the projection of the first transmission line on the reference plane and the projection of the second transmission line on the reference plane, and has no intersection with at least one of the projection of the first transmission line and the projection of the second transmission line.

4. The circuit board of claim 3, wherein the second part and the third part are extended from opposite sides of the first part.

5. The circuit board of claim 3, wherein the first part has intersections with both the projection of the first transmission line and the projection of the second transmission line, and the second part and the third part have no intersection with both the projection of the first transmission line and the projection of the second transmission line.

6. The circuit board of claim 5, wherein the second part and the third part are extended from opposite sides of the first part.

* * * * *